United States Patent [19]

Faxon

[11] 4,424,545
[45] Jan. 3, 1984

[54] TAILBITER AND OPEN MAGNETRON PROTECTION CIRCUIT

[75] Inventor: Merle W. Faxon, Kingston, N.H.

[73] Assignee: Raytheon Company, Lexington, Mass.

[21] Appl. No.: 357,943

[22] Filed: Mar. 15, 1982

[51] Int. Cl.³ .............................................. H02H 9/04
[52] U.S. Cl. .......................................... 361/91; 328/8
[58] Field of Search .................... 361/204, 91, 58, 88; 328/8, 9, 10

[56] References Cited

U.S. PATENT DOCUMENTS 4,171,514 10/1979 Faxon ................................. 328/8 X Primary Examiner—Reinhard J. Eisenzopf
Attorney, Agent, or Firm—Herbert W. Arnold; Joseph D. Pannone

[57] ABSTRACT

A tailbiter and open magnetron protection circuit for a radar pulse modulator having an extra winding on the modulator output transformer which combines a circuit to shorten a short range radar pulse with a circuit for applying a substantially constant load to the modulator when the magnetron is open or inactive. The extra winding on the transformer is connected in series with a saturable reactor which prevents shorting the desired short pulse width and stores undesired pulse energy in a capacitor and an SCR tailbiter circuit to short the excess pulse energy to ground in the interpulse period upon actuation of the SCR. Also included in the tailbiter circuit is an alternate path through a voltage divider and zener diode to the SCR gate which, whenever the magnetron is open or does not fire, a voltage build-up exceeding the zener voltage triggers the SCR gate circuit to maintain a substantially constant load on the primary of the modulation transformer.

12 Claims, 2 Drawing Figures

TAILBITER AND OPEN MAGNETRON PROTECTION CIRCUIT

BACKGROUND OF THE INVENTION

This invention relates to an over voltage protection and pulse shortening circuit for use with a pulsed oscillator such as a magnetron and radar modulator, and more particularly, to a protection circuit which performs as a pulse shortening or tailbiting circuit for the magnetron and also is used to apply a protective load to the radar modulator when the magnetron becomes open or inactive.

Many radar modulator circuits have a magnetron or other oscillator to provide a radar pulse and utilize spark gap type devices designed to short out during an elevated voltage resulting from an open magnetron. These spark gap devices are used to prevent the modulator from applying twice the operating voltage to the open magnetron and associated circuitry. However, spark gap type devices of this type are generally unreliable, have a limited lifetime and are relatively expensive to replace. Further, radar operation at shorter ranges frequently involves shorting the tail of the radar pulse to ground through an expensive relay, the contacts of which have a limited life. At the same time, these radar modulator components are expensive to replace and must operate at the relatively high voltage applied to the magnetron which leads to arcing and other faulty radar operation. It is, accordingly, an object of the invention to provide a relatively simple and improved circuit which recognizes the aforementioned disadvantages and utilizes relatively inexpensive low voltage solid state circuitry to perform the dual function of accurate tailbiting and protective loading in a radar modulator.

It is a further object of the invention to provide a low cost protection circuit for a modulator in which a single solid state device and its associated circuitry functions both as an open magnetron protective loading device and as a short pulse tailbiting device.

It is another object of the invention to provide an improved modulator protection circuit capable of operating at low voltage which also functions as a short pulse tailbiting circuit for improved pulse accuracy.

SUMMARY OF THE INVENTION

In accordance with the invention, the foregoing objects and related advantages are attained in an improved circuit which combines a circuit which protects a radar pulse modulator against over voltage resulting from an open magnetron with a tailbiting circuit for shortening short radar pulses transmitted on the shorter end of the radar range. In particular, protection against damage to a radar modulator by applying a load to maintain a substantially constant impedance on the modulator when the magnetron becomes open or inactive, is achieved by addition of an extra output winding on the modulator output transformer which applies the load to the modulator, the extra winding being connected in series with a saturable reactor to maintain by hold-off action a predetermined desired pulse width and an SCR tailbiter circuit having a rectifier and capacitor to store undesired pulse width energy in the capacitor and adapted to short the excess pulse width to ground upon actuation of the SCR at the end of the shortened pulse period. Also, included in such tailbiter circuit is an alternate path from the extra winding through a voltage divider and zener diode to the SCR gate which, in response to overvoltage, is adapted to trigger the SCR gate circuit to conduct and reflect a protective load on the primary of the modulation transformer and modulator. In this manner, the circuit is working at a lower voltage with reference to the magnetron voltage as well as utilizing reliable solid state components in which a single low cost SCR performs both the tailbiting and protective functions. The additional output winding preferably has approximately a two to one ratio to the primary winding for lower leakage inductance to the secondary winding.

BRIEF DESCRIPTION OF THE DRAWINGS

Other characteristics of the invention will be apparent upon reference to the following description of the embodiments of the invention schematically illustrated in the accompanying drawings in which.

DESCRIPTION OF THE PREFERRED EMBODIMENTS

Figure 1:
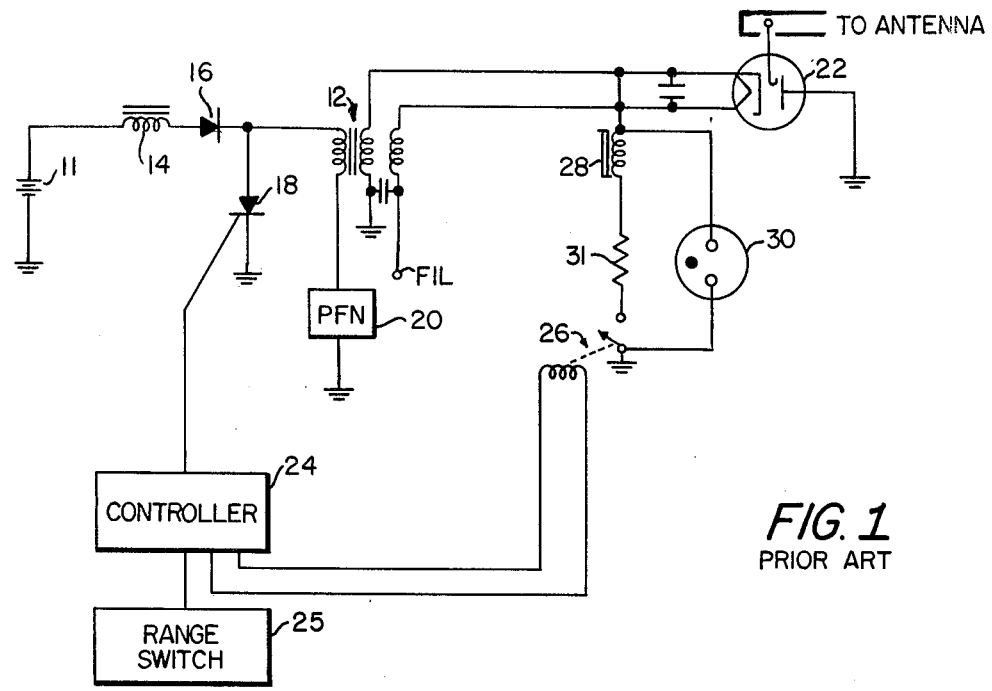
FIG. 1 is a schematic diagram of a well-known radar modulator circuit incorporating tailbiter and open magnetron protection circuits.

FIG. 1 shows a well-known magnetron radar modulator circuit which utilizes a DC energy source 11 (which can be either a sine wave, square wave or other AC waveform). The energy source is connected to the primary winding of a conventional modulation transformer 12 by way of a conventional charging choke 14, isolating diode 16 and a discharge circuit comprising a discharging SCR gate 18 which, upon an appropriately timed trigger pulse, provides discharge of a conventional pulse forming network 20 to provide a modulation pulse in the primary winding of modulation transformer 12 and thereby pulse magnetron 22 in a well-known magnetron transmit circuit. The length of the magnetron output pulse is usually determined in part by the DC constants of the pulse forming network and the time of discharge of the main SCR discharge gate 18 in response to timing pulses from a conventional controller 24 which generates a series of trigger pulses to cause the SCR to conduct. These controller signals in a typical radar usually emanate from a conventional radar range selection circuit 25 which causes the SCR 18 to start conducting at shorter intervals of time commensurate with the selection of a shorter radar range. A typical radar modulator and range selection circuit is shown in U.S. Pat. No. 4,171,514 of Merle W. Faxon, issued Oct. 16, 1979, and assigned to the assignee of this invention.

Also, as shown in FIG. 1, the secondary winding of the modulation transformer 12 is bifilar windings 13b and 13c connected to the magnetron cathode-filament circuit. In order to cut off or tailbite the end of a magnetron pulse, saturable reactor 28 holds off or prevents shorting the desired short pulse width. When the saturable reactor 28 has held off to the desired short pulse width, it saturates and energy flows through high voltage relay 26 which, for short pulse operation, has been closed by a signal from controller 24 into the coil of relay 26. This relay is closed during the short pulse period and remains closed to perform the desired high voltage tailbiting operation of saturable reactor 28 in series with a load resistor 31. During an over voltage peak resulting from failure of the magnetron heater or failure to properly fire, glow tube 30 is connected to fire and shunt the voltage build up to ground through load resistor 31. This conventional circuit thus provides a negative safety voltage in the absence of magnetron firing. From the above arrangement, it is noted that the high voltage relay 26 is subject to mechanical wear, is relatively expensive to replace and its contacts have limited life. Glow tube 30 also is a well-known spark gap type device using argon and tritium, has limited life and is expensive to replace, while both the relay and glow tube are subject to the high voltage used to pulse the magnetron resulting in a tendency toward arcing.

Figure 2:
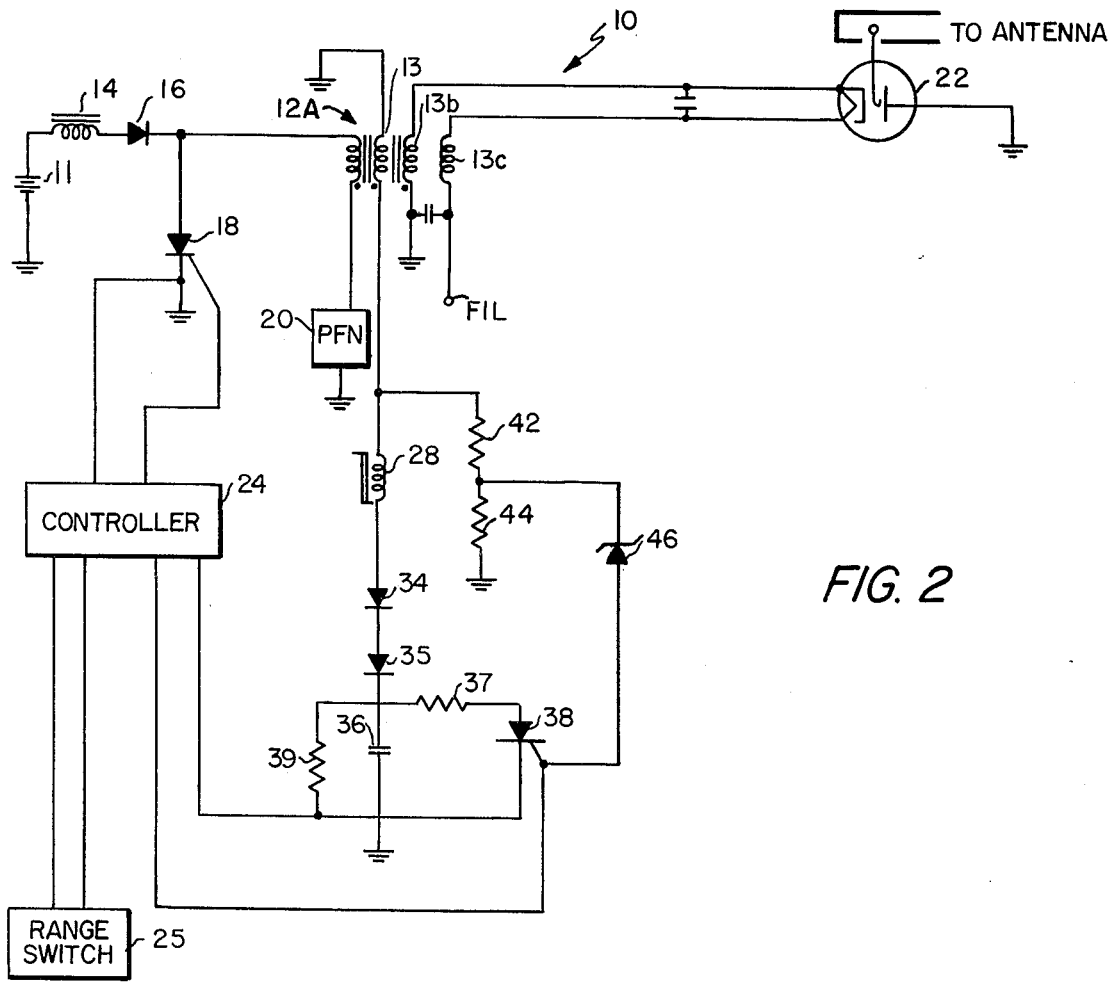
FIG. 2 is a simplified schematic diagram of the combined tailbiter and open magnetron protection circuit.

Referring now to FIG. 2, there is shown an embodiment of the invention in which a novel circuit utilizes the same SCR to perform both functions of tailbiting and open magnetron protection. FIG. 2 shows current flowing in an additional winding 13 on a radar modulator transformer 12 being used in a novel manner to reduce by low voltage tailbiting the width of the short radar transmitter pulse and to automatically apply a protective load to the modulator when the magnetron is open or inactive. The modulator operates substantially like that shown in FIG. 1 and corresponding parts of FIGS. 1 and 2 and the following figures bear the same reference numbers. The extra winding 13 on transformer 12A preferably has greater than a 2:1 ratio to the primary and includes, for example, eight turns of No. 22 wire, one end of which is grounded and the other end is connected to a saturable reactor 28 which prevents or holds off shorting the predetermined desired pulse width. When the saturable reactor 28 has held off the desired pulse width, it saturates. Undesirable pulse energy at the tail of the pulse then flows through series connected isolating diodes 34, 35 into a capacitor 36 inasmuch as SCR 38 is adapted to remain closed in the short pulse period and is open during a typical long pulse period as determined in a well-known manner by a range selection switch 25A connected to controller circuit 24. Capacitor 36 thus stores the voltage developed by winding 13 and the charged capacitor 36 permits the long pulse to remain "on". It should be noted that when saturable reactor 28 has held off the pulse to the desired pulse width, it saturates. Undesirable pulse energy then flows through diode 34, diode 35 and into storage capacitor 36 which stores this undesired pulse energy. For discharging this stored pulse energy to ground, SCR 38 is activated when changing range by a well-known timing controller 24 fed by a conventional range switch 25.

In operation, when SCR 38 is activated, it bleeds in the interpulse period the undesirable energy stored in, for example, a 0.5 microfarad capacitor 36 to ground through a series connected 70 ohm resistor 37 and parallel connected resistor 39 which times the discharge of capacitor 36. Thus, when saturable reactor 32, diodes 34 and 35, capacitor 36, resistors 37, 39 and SCR 38 are activated, they form the tailbiter circuit which discharges the undesirable stored energy in the short interpulse period. In a novel combination with this tailbiter circuit is an open magnetron protection circuit in which a series connected resistor 42, resistor 44 form a divider circuit with a zener diode 46 which operates as an open magnetron voltage discharge circuit. Resistors 42 and 44 thus divide the peak voltage developed across winding 13 of transformer 12A in the open magnetron condition. The load across secondary or output windings 13b, 13c of transformer 12A are connected to supply high voltage to magnetron 22.

When magnetron 22 becomes open, the divided voltage across resistors 42, 44 exceeds the zener voltage across zener diode 46 46 and the zener diode conducts and causes SCR 38 to be activated. Conduction of SCR 38 presents a load to ground to primary winding 13a which is similar to the load provided by the normally operating magnetron 22. This protects the main discharge SCR 18 from latching on and conducting during a positive impedance mismatch which occurs in a no load situation, as in the instance of an open magnetron. This open magnetron protection circuit thus maintains a substantially constant impedance presented to the transformer primary which prevents the modulator 10 from applying over twice the normal operating voltage to the magnetron 22 and associated circuitry. Thus by combining a tailbiting and protection circuit in a single low voltage solid state SR device, spark gaps and other limited lifetime devices are eliminated and by operating at a lower voltage with reference to the magnetron voltage, the low voltage protection circuit provides almost unlimited life for the other circuits of the modulator.

This completes the description of the embodiments of the invention illustrated herein. However, many modifications thereof will be apparent to persons skilled in the art without departing from the spirit and scope of this invention. Accordingly, it is intended that the invention be not limited to the particular details of the embodiments described herein except as defined by the appended claims.

What is claimed is:

1. In combination:
    a radar modulator including a transformer having a primary winding and a secondary winding connected to provide modulator pulses to a magnetron;
    said transformer having an independent winding magnetically coupled to said primary and secondary windings and adapted to reflect a lower leakage reactance to the secondary winding of said transformer than to said primary winding;
    one end of said independent winding connected to ground;
    a saturable reactor connected to the other end of said independent winding and an SCR adapted to maintain a predetermined pulse width and store excess pulse energy in a capacitor circuit upon saturation of said saturable reactor;
    means including said SCR connected in parallel with said capacitor circuit and adapted to discharge said excess pulse energy during the interpulse period of said radar modulator; and
    means including a zener diode connected from the other end of said independent winding and the input of said SCR, said zener diode adapted to initiate conduction in said SCR to present a protective load on said primary winding in response to excess voltage due to failure of said magnetron to fire, said loaded primary winding thereby preventing said modulator from applying excess operating voltage to said magnetron and associated circuitry during misfire or open circuit conditions.

2. A radar modulator including a transformer having a primary winding connected to a source of modulation pulses, a secondary winding connected to provide modulator pulses to a magnetron;

said transformer having an independent winding magnetically coupled to said primary and secondary windings, one end of said independent winding connected to ground;

a storage capacitor;

a saturable reactor connected in series with the other end of said independent winding and adapted to maintain a predetermined width of said modulator pulses and to store excess pulse energy in said storage capacitor upon saturation of said saturable reactor;

means including an SCR adapted to discharge said stored energy representing excess pulse width in said storage capacitor to ground during the interpulse period of said radar modulator; and means including a zener diode adapted to initiate conduction in said SCR in response to an increase in voltage applied thereto resulting from a misfire of said magnetron, said conduction of said SCR discharging stored energy through resistance means to maintain a protective constant load on said modulator.

3. In combination:

a radar modulator including a modulator transformer having a primary winding and a secondary winding and adapted to provide modulator pulses to a magnetron in response to discharge of a pulse forming network;

said transformer having an independent winding magnetically coupled to said primary and secondary windings and adapted to reflect a lower leakage reactance to the secondary winding of said transformer than to said primary winding;

one end of said independent winding connected to ground;

a saturable reactor connected in series with the other end of said independent winding and a storage circuit;

means upon conduction at a predetermined pulse width adapted to store excess energy in said storage circuit;

circuit means including an SCR adapted to remove excess energy beyond a particular pulse width from said storage circuit; and means in response to excess voltage applied at the output of said modulation transformer during misfire of said magnetron to initiate conduction in said SCR to discharge said stored energy through resistance means to maintain a substantially constant load on said modulator.

4. In combination:

a radar modulator including a transformer having a primary winding and a secondary winding connected to provide modulator pulses to a magnetron;

said transformer having an independent winding magnetically coupled to said primary and secondary windings and adapted to reflect a lower leakage reactance to the secondary winding of said transformer than to said primary winding;

one end of said independent winding connected to ground;

a saturable reactor and a storage capacitor circuit serially connected from the other end of said independent winding and ground adapted to maintain predetermined pulse width and store excess pulse energy in said storage capacitor circuit in response to saturation of said saturable reactor;

means including an SCR connected across a capacitor in said storage capacitor circuit adapted to shunt said excess energy to ground in the interpulse period of said radar modulator; and means including a zener diode connected in circuit with said independent winding and the input gate of said SCR for initiating conduction in said SCR in response to a rise in voltage developed in said independent winding upon an operational defect in said magnetron thereby to maintain a substantially constant load on said modulator.

5. In combination:

a radar modulator including a transformer having a primary winding and a secondary winding connected to provide modulator pulses to a magnetron;

said transformer having an independent winding magnetically coupled to said primary and secondary windings and adapted to reflect a lower leakage reactance to the secondary winding of said transformer than to said primary winding;

one end of said independent winding connected to ground;

means including a saturable reactor coupled to said independent winding for maintaining a predetermined pulse width, said means including a capacitor for storing excess pulse energy;

means for shunting said energy to ground in the interpulse period; and means including a zener diode connected in circuit with said independent winding for initiating conduction in an SCR circuit in response to a rise in voltage in said independent winding to maintain a substantially constant load on said modulator.

6. In combination:

a radar modulator including a transformer having a primary winding and a secondary winding connected to provide modulator pulses to a magnetron;

said transformer having an independent winding magnetically coupled to said primary and secondary windings and adapted to reflect a lower leakage reactance to the secondary winding of said transformer than to said primary winding;

one end of said independent winding connected to ground;

means coupled to said independent winding for maintaining a predetermined pulse width including means for storing excess pulse energy beyond a predetermined pulse length; and means fed by the other end of said independent winding for maintaining a substantially constant load on the primary winding of said modulator during a rise in voltage in said independent winding in the presence of a magnetron failure.

7. In combination:

a radar modulator including a transformer having a primary, secondary and independent winding;

said secondary winding adapted to feed radar pulses to a magnetron;

said independent winding coupled to an energy storing circuit for storing and dissipating excess pulse energy developed on said independent winding beyond a predetermined pulse length; and means coupled to said independent winding to maintain in the presence of a magnetron a substantially constant load on said modulator to prevent excessive voltage build up being applied to said magnetron.

8. An overvoltage protective circuit for preventing the output voltage of a modulator from exceeding a preset value when an associated magnetron becomes open or inactive comprising:
   a modulation transformer having a primary for receiving a modulator pulse;
   a secondary adapted to apply said pulse to said magnetron;
   a third winding magnetically coupled to said first and second windings;
   means cooperating with said third winding in the presence of operational failure of said magnetron to provide a load on said primary substantially equal to the load presented by a normally operating magnetron, said latter means including a tailbiter circuit for charging a capacitance to a predetermined level, said charged capacitance cooperating with said third winding and SCR conduction means for discharging said charged capacitance through a predetermined resistance in response to overvoltage developed in said third winding thereby to maintain a substantially constant load on said modulator.

9. An overvoltage protective circuit of claim 8 including a zener diode coupled in circuit with the third winding and adapted to initiate conduction in said SCR conduction means in response to overvoltage developed in said third winding.

10. An overvoltage protective circuit for preventing the output voltage of a modulator from exceeding a preset value when an associated magnetron becomes open or inactive comprising:
    a modulation transformer having a primary for receiving a modulator pulse;
    a secondary adapted to apply said pulse to said magnetron;
    a third winding magnetically coupled to said first and second windings;
    means cooperating with said third winding in the presence of operational failure of said magnetron to provide a load on said primary substantially equal to the load presented by a normally operating magnetron, said latter means including a capacitance and a saturable reactor adapted to charge said capacitance to a predetermined level upon saturation of said saturable reactor, said charged capacitance cooperating with said third winding and SCR conduction means for discharging said charged capacitance and preventing overvoltage from developing in said secondary winding by maintaining a substantially constant load on said modulator transformer.

11. An overvoltage protective circuit defined in claim 10 in which the means for discharging the charged capacitance including a bleeder resistor connected in parallel with said capacitance.

12. An overvoltage protective circuit defined in claim 10 in which isolating diode means is connected in series with said third winding.

* * * * *